United States Patent [19]
Pelly

[11] Patent Number: 5,804,873
[45] Date of Patent: Sep. 8, 1998

[54] HEATSINK FOR SURFACE MOUNT DEVICE FOR CIRCUIT BOARD MOUNTING

[75] Inventor: Brian R. Pelly, Palos Verdes Estates, Calif.

[73] Assignee: International Rectifier Corporation, El Segundo, Calif.

[21] Appl. No.: 790,842

[22] Filed: Jan. 30, 1997

Related U.S. Application Data

[60] Provisional application No. 60/010,979 Feb. 1, 1996.
[51] Int. Cl.⁶ .................................................. H01L 23/495
[52] U.S. Cl. .......................... 257/675; 257/712; 257/713; 257/721; 257/722
[58] Field of Search .................................... 257/675, 712, 257/713, 721, 722, 796

[56] References Cited

U.S. PATENT DOCUMENTS 5,047,837  9/1991  Kitano et al. .......................... 257/722

*Primary Examiner*—Tom Thomas
*Assistant Examiner*—Roy Potter
*Attorney, Agent, or Firm*—Ostrolenk, Faber, Gerb & Soffen, LLP

[57] ABSTRACT

A surface mount package is provided with a U-shaped heatsink which is coupled to exposed portions of a bottom plate of the package. The bottom plate of the surface mount package is provided with border strips which extend beyond the edge of an encapsulated portion of the package such that the heatsink may be coupled thereto.

14 Claims, 1 Drawing Sheet

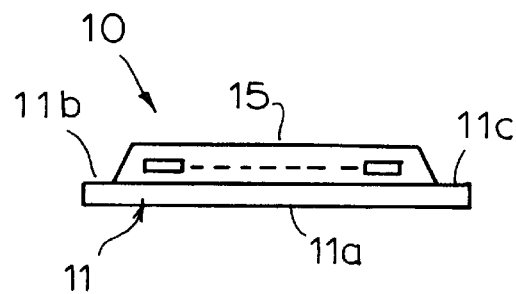
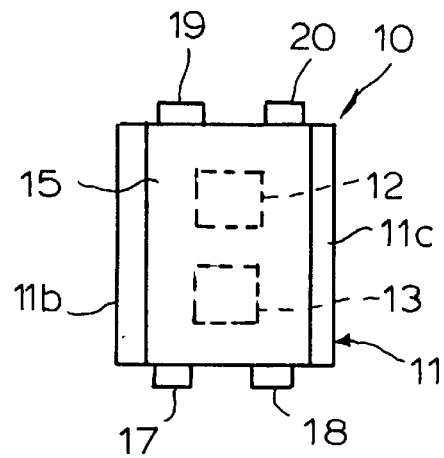
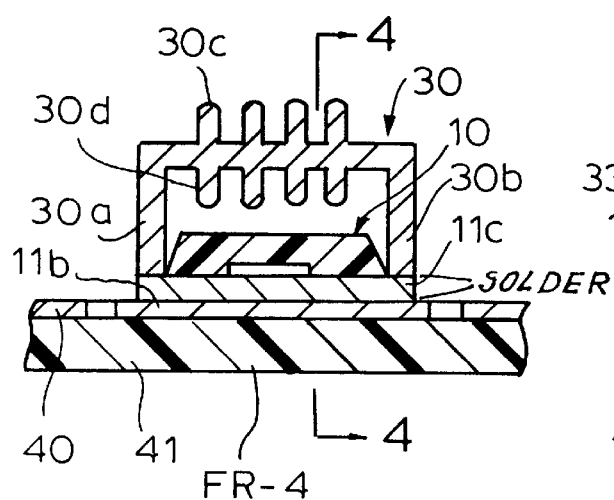
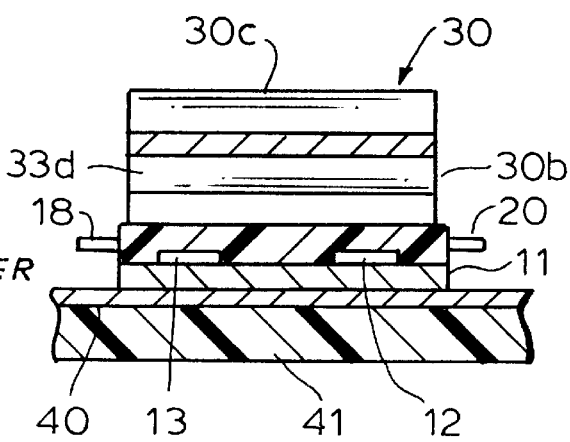
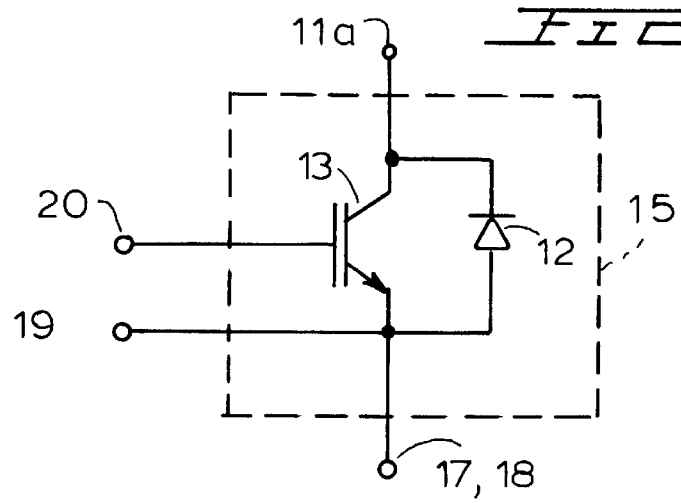

HEATSINK FOR SURFACE MOUNT DEVICE FOR CIRCUIT BOARD MOUNTING

CROSS REFERENCE TO RELATED APPLICATIONS

This application is based on U.S. Provisional patent application Ser. No. 60/010,979, filed Feb. 1, 1996, entitled HEATSINK FOR SURFACE MOUNT DEVICE FOR CIRCUIT BOARD MOUNTING.

1. Field of the Invention

This invention relates to heatsinks, and more specifically relates to a novel heatsink for a surface mount package which contains one or more semiconductor die therein.

2. Background of the Invention

Surface mount packages are well known for semiconductor devices in which a flat bottom conductor in thermal communication with one or more semiconductor die can be soldered, or otherwise connected, to a flat heatsink support. The die within the package are contained within a plastic housing fixed to the flat bottom conductor, and power and control signal conductors extend from the die through the sides or ends of the plastic body for connection to external circuits.

The overall package has a low height and is adapted to be soldered down to a support surface, which may be a printed circuit board or, if high current is to be handled, an insulated metal substrate (IMS) board which is a flat support board consisting of a thick flat metal (preferably aluminum) body having a thin thermally conductive but electrically insulating film (preferably a polymer) disposed thereon and having a thin patternable copper layer atop the film. The copper is patterned to form connection pads for devices to be mounted thereon and conductive traces to interconnect such devices. Heat can be rapidly removed from power devices mounted on IMS boards through the thin insulation layer and into the heavy aluminum body.

IMS boards are expensive and, where possible, the use of a less expensive conventional printed circuit board, for example, an FR-4 printed circuit board is desired. Unfortunately, conventional printed circuit boards do not alone provide adequate cooling for high heat dissipating surface mount packages. Therefore, an IMS or some other device which provides a heatsink, an isolation medium for mounting the power components and interconnections for coupling the surface mount packages to other surface mount packages and to other control circuits on a conventional printed circuit board is required.

Clip-on and screw-on heatsinks are available for use with a surface mount package; however, such heatsinks require additional assembly steps in the manufacturing process resulting in increased costs. Further, such heatsinks are not soldered or otherwise bonded to the bottom conductor of the surface mount package and, therefore, the transfer of heat therebetween is inefficient and increased die temperature results.

Thus, there is a need in the art for an alternate cost effective method of cooling a surface mount package on a conventional printed circuit board such that entire circuit assemblies, for example, a motor controller, can be mounted on a single insulation printed circuit board rather than having to use an expensive IMS.

SUMMARY OF THE INVENTION

In accordance with the preferred embodiment of the invention, a generally U-shaped heatsink is fixed over the top of a surface mount package, with the bottoms of its legs soldered to the bottom heatsink of the package.

A known surface mount power package, which contains one or more power die, suitable for accepting the U-shaped heatsink of the preferred embodiment of the present invention is sold under the name SMD-10 by the International Rectifier Corporation.

The package of the SMD-10 is flat and has a bottom conductive plate which is solderable to a heatsink or other support and which extends beyond the boundary of its upper insulation cap.

In accordance with the invention, a novel U-shaped heatsink is disposed above and around the insulation cap. Conductive fins may extend from the top and bottom surfaces of the heatsink. Air or other cooling fluid can flow through the channel between the insulation cap and the interior surface of the heatsink.

It is now possible to mount a power surface mount semiconductor package, such as the SMD-10, on a conventional printed circuit board, such as an FR-4 board, which may contain other components of a circuit, without requiring an IMS board or the like.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

FIG. 1 is an end view of a surface mount package.

FIG. 2 is a top view of the device of FIG. 1.

FIG. 2a is a circuit diagram of two typical devices mounted within the package of FIGS. 1 and 2.

FIG. 3 is a cross-section of the device of FIGS. 1 and 2 when mounted on a conventional printed circuit board along with the novel surface mounted heatsink of the invention.

FIG. 4 is a cross-section of FIG. 3 taken across the section line 4—4 in FIG. 3.

DETAILED DESCRIPTION OF THE INVENTION

Referring now to the drawings wherein like numerals indicate like elements, there is shown in FIGS. 1 and 2 a surface mount package 10, such as the SMD-10 package previously referred to. The package 10 consists of a conductor bottom plate 11 which has a solderable bottom 11a and solderable end terminals 17, 18, 19, and 20. The power semiconductor die 12 and 13 are soldered down to plate 11. It is noted that one or more such die can be used.

The die 12 and 13 are interconnected, for example, by bonding wires connected to the tops of the die, and the device is encapsulated by a molded insulation housing or cap 15. Suitable terminals, such as power terminals 17 and 18 and control terminals 19 and 20, extend out of the insulation housing 15.

The die 12 and 13 are preferably a diode and an IGBT respectively, connected in an anti-parallel relationship, as shown in FIG. 2a. FIG. 2a schematically shows the terminals 17 to 20 penetrating to the exterior of the housing 15.

It is noted that the edges of the bottom plate 11 extend beyond the edge of the insulation housing 15. Thus, as seen in FIGS. 1 and 2, the border strips 11b and 11c are exposed beyond the border of the housing 15.

In accordance with a preferred embodiment of the invention, and as shown in FIGS. 3 and 4, a surface mounted heatsink 30, which is generally U-shaped, preferably has the bottoms of its legs 30a and 30b soldered to the top exposed surfaces of the border strips 11b and 11c, respectively. The heatsink 30 is preferably open at either end such that air or other coolants may pass over the outside surface thereof and over the inside surface thereof. The heatsink 30 is preferably formed of copper.

The surface mount package 10 and heatsink 30 assembly is preferably soldered down to a conventional patterned solder pad 40 on an insulation board 41, which may be an FR-4 board. The heatsink 30 is preferably soldered to the conductive plate 11 when the surface mount package 10 is soldered to the pad 40. Advantageously, considerable cost savings are enjoyed because the heatsink 30 is soldered to the plate 11 in the same step as soldering the package 10 to the pad 40.

Other components, not shown, may also be connected to the board 41 and interconnected by way of conductive traces on the pad 40. Thus, the need for an expensive IMS board is avoided by employing the novel top or surface mountable heatsink 30 to remove heat from the surface mount package 10.

The heatsink 30 may also be connected to other portions of the conductive plate 11. Further, the heatsink 30 may have fins 30c on its outer surface and fins 30d on its inner surface. Thus, air or other coolants can flow through the channel formed by the U-shaped heat sink 30 and remove heat from both of its surfaces.

Furthermore, it is even possible to widen heat sink 30 so that its legs 30a and 30b straddle plate 11, contacting its outer edges if desired, and soldering the legs 30a and 30b to the underlying substrate to which the plate 11 is soldered. The solder connection can also extend to plate 11 as in other embodiments.

The foregoing description of the preferred embodiments of the present invention has been provided for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A surface mount semiconductor package comprising:
    a bottom plate to which at least one semiconductor device is operatively coupled, the bottom plate including first and second border strips being substantially co-planar with the bottom plate;
    a molded insulating housing which operatively engages the bottom plate and encapsulates the semiconductor device, the first and second border strips extending beyond respective edges of the housing; and
    a U-shaped heatsink including:
        a top member having an outside surface and an inside surface; and
        first and second side members being spaced apart from one another and, at one end, extending from the top member and, at another end, being coupled to the first and second border strips respectively.

2. The surface mount semiconductor package of claim 1, wherein the top member of the heatsink is spaced away from the housing such that a channel is formed therebetween, the heatsink being open at its ends such that air may flow through the channel.

3. The surface mount semiconductor package of claim 1, wherein the top member of the heatsink includes fins disposed on the outside surface thereof.

4. The surface mount semiconductor package of claim 1, wherein the top member of the heatsink includes fins disposed on the inside surface thereof.

5. The surface mount semiconductor package of claim 1, wherein the top member of the heatsink includes fins disposed on the inside surface and the outside surface thereof.

6. The surface mount semiconductor package of claim 1, wherein the first and second border strips include top surfaces to which the first and second side members are respectively connected.

7. The surface mount semiconductor package of claim 1, wherein the bottom plate is adapted to be bonded to a printed circuit board.

8. The surface mount semiconductor package of claim 1, further comprising a plurality terminals being substantially co-planar with the bottom plate, the terminals providing electrical connections to the semiconductor device.

9. A surface mount semiconductor package comprising:
    a substantially rectangular, flat bottom plate having a surface to which at least one semiconductor device is operatively coupled, the bottom plate including first and second opposite sides each including a border strip;
    a molded insulating housing which substantially covers the surface of the bottom plate to which the semiconductor device is coupled except for the first and second border strips; and
    a U-shaped heatsink including:
        a substantially rectangular top member corresponding in size to the bottom plate, the top member having a pair of longer sides, a pair of shorter sides, an outside surface and an inside surface; and
        first and second side members being spaced apart from one another and, at one end, extending substantially perpendicularly from the longer sides of the top member respectively and, at another end, being coupled to the first and second border strips respectively such that the inside surface of the top member opposes the housing.

10. The surface mount semiconductor package of claim 9, wherein the top member of the heatsink is spaced away from the housing such that a channel is formed therebetween, the heatsink being open at its ends such that air may flow through the channel.

11. The surface mount semiconductor package of claim 9, wherein the top member of the heatsink includes fins disposed on the outside surface thereof.

12. The surface mount semiconductor package of claim 9, wherein the top member of the heatsink includes fins disposed on the inside surface thereof.

13. The surface mount semiconductor package of claim 9, wherein the top member of the heatsink includes fins disposed on the inside surface and the outside surface thereof.

14. The surface mount semiconductor package of claim 9, wherein the first and second border strips include top surfaces to which the first and second side members are respectively connected.

* * * * *